United States Patent [19]
Steiner

[11] Patent Number: 5,937,518
[45] Date of Patent: Aug. 17, 1999

[54] BURR-FREE WORKPIECE AND METHOD OF FORMING

[75] Inventor: Ronald E. Steiner, Agoura, Calif.

[73] Assignee: International Electronic Research Corp., Burbank, Calif.

[21] Appl. No.: 09/002,752

[22] Filed: Jan. 5, 1998

[51] Int. Cl.⁶ .............................. B23P 15/26; H05K 7/20
[52] U.S. Cl. .................... 29/890.03; 29/557; 83/862; 83/875; 83/917; 165/80.3; 165/185; 257/722; 361/704; 409/132
[58] Field of Search .................... 29/890.03, 557; 83/862, 875, 917; 409/131, 132; 165/80.3, 185; 174/16.3; 257/722; 361/704, 703

[56] References Cited

U.S. PATENT DOCUMENTS

| | | | |
|---|---|---|---|
| 4,879,891 | 11/1989 | Hinshaw | 29/890.03 X |
| 5,249,359 | 10/1993 | Schubert et al. | 29/890.03 |
| 5,519,938 | 5/1996 | Kojima et al. | 29/890.03 |
| 5,602,719 | 2/1997 | Kinion | 361/704 |
| 5,726,495 | 3/1998 | Aihara et al. | 257/722 |

*Primary Examiner*—Leonard Leo
*Attorney, Agent, or Firm*—Bruce A. Jagger

[57] ABSTRACT

A finished workpiece of malleable metal containing a saw cut which does not require deburring because the small burr on the exit side of the cut is concealed within a three sided notch. An elongated notch, closed on three sides, is formed on the side of the blank workpiece from which the saw blade exits. The depth of the cut is adjusted so that the bottom of the cut, together with its attendant burr, intersects with the notch. The burr is thus attached to a wall within the notch. The width of the notch is adjusted so that the anticipated tolerance in the depth of the cut (and thus the location of the bottom of the cut) is accommodated. The width of the notch is such that the bottom of the cut will intersect the notch at any location within the anticipated tolerance envelope. The depth of the notch is sufficient to conceal the burr.

13 Claims, 9 Drawing Sheets

PRIOR ART

BURR-FREE WORKPIECE AND METHOD OF FORMING

BACKGROUND OF THE INVENTION

1. Field of the Invention

The invention relates in general to forming workpieces which do not require deburring, and, in particular, to configuring a workpiece blank and cutting that blank so that deburring is not required, and the resulting finished workpieces.

2. Description of the Prior Art

It is inevitable when cutting certain materials such as, for example, aluminum or copper (the terms "aluminum" and "copper" are used to include the pure metals and all of their alloys), that a burr will be formed by the cutting tool as it exits the workpiece. Conventionally, when they can not be tolerated, such burrs are removed by a secondary operation such as wire brushing. This secondary operation is expensive, inexact, inefficient, and time consuming.

Those concerned with these problems recognize the need for an improved method which provides a satisfactory manufactured object and obviates the need for a deburring step.

BRIEF SUMMARY OF THE INVENTION

A preferred embodiment of the according to the present invention comprises selecting a specially configured workpiece which, with appropriate control of the cutting tool, obviates the need to deburr the finished workpiece.

A metal saw is particularly prone to causing the formation of burrs at the bottom of the cut as it exits a metal workpiece. Such burrs are particularly objectionable when the exit side of the workpiece is a flat surface (arcuate or planar). The burr tends to project out from the surface by as much as, for example, 0.050 inches or more, particularly when the workpiece is composed of a malleable metal such as, for example, aluminum or copper, or the like. This burr forming problem has been particularly troublesome in the heat sink art where gang saws are used to form a plurality of heat dissipating fins or pins in one pass through the workpiece.

It has been found, according to the present invention, that the provision of a notch, frequently in the form of an elongated groove, in the exit side of the workpiece, when the cut is terminated within the notch, will prevent the formation of an objectionable burr. Preferably, the notch is closed on three sides. Such a workpiece is herein described as being "burr-free". A small burr sometimes is present at the bottom of the notch, set inwardly from the surface of the workpiece. This burr, however, is not objectionable, and need not be removed, because it does not interfere with the use of the workpiece for its intended purpose. It does not project beyond the depth of the notch. The workpiece is "burr-free" in the sense that it does not require deburring to be useful for its intended purpose.

The notch is located so as to intersect the bottom of the cut which is formed in the workpiece. The notch does not prevent the formation of a burr. Rather, it causes the burr which normally forms on the exit side of the workpiece to be ejected, and prevents any burr which forms inside the notch from extending out to the surface of the exit side. The bottom of the cut, with any burr which may form, terminates in a burr wall. The burr wall is a wall of the notch which is recessed from the exit side of the workpiece. Any burr which is formed in this burr wall is generally very short as compared to one which may form as the cutting tool travels through the normally relatively long reach of the exit side.

The notch can be elongated or not depending upon what is required to position it at the bottom of the cut where the cutting tool exits the exit side of the workpiece. Where a plurality of cuts are to be made in a workpiece, the notch is elongated so as to intersect with each of the bottoms of the cuts. Where the notch is elongated, no special care, other than depth control, need be taken to insure that the bottom of the cut will be aligned so as to intersect with the notch. The notch is conveniently formed, for example, by extrusion, machining, or the like. A notch can be formed on either side of the workpiece so that it can be cut from either side. That is, the workpiece is not orientation specific, and no special care need be taken as to which is the exit side.

The notch is proportioned so as to conceal any burr which may be formed. To this end, the notch is generally closed on three sides, and deeper than the expected length of any burr which may be anticipated to be attached to the burr wall. In any machining operation there is inevitably some tolerance in the depth to which the cutting tool cuts. The minimum width of the notch is adjusted to accommodate the permitted tolerance in the depth of the cut. In general, particularly where the cutting tool is a metal saw blade, the notch should be proportioned so as to effectively conceal any burr which is formed on the burr wall over a range of cut depths which vary by as much as approximately 0.015 to 0.050 inches. In general, the location on the burr wall where any burr is likely to form should be recessed by at least approximately 0.015 to 0.050 inches from the exit side of the workpiece. Thus, a notch should generally have a burr wall which is spaced inwardly from the exit side by at least about 0.015 inches, and it should have a width of at least about 0.015 inches. Where precision machining operations are employed to form the cut, the tolerance on the depth of the cut is more closely controlled, and the width of the notch can be reduced, for example, to less than about 0.010 inches. Where the workpiece is composed of material which does not form long burrs, the depth of the notch can be reduced, for example, to less than about 0.10 inches.

The width of the notch should generally not be significantly wider than is required to accommodate the necessary tolerance in the depth of the cut. Wider notches are less effective in concealing the burrs. If the notch is made too wide it simply forms a second exit side which would require deburring to be acceptable for its intended use. The depth of the notch is determined by the length of the burr which is expected to be formed on the burr wall. The burr should be fully concealed within the notch. The burr length is dependent upon the nature of the material from which the workpiece is formed, and the character of the cutting operation, as well as other factors.

In general, it has been found that the bottom of the cut should be as close as possible to the location where the exit side transitions to the notch. This is believed to result in burrs of the minimum possible length.

If removal of the burr from the notch is required for a particular application, such removal is facilitated by the fact that the notch provides a guide for a suitable deburring tool.

Other objects, advantages, and novel features of the present invention will become apparent from the following detailed description of the invention when considered in conjunction with the accompanying drawings.

BRIEF DESCRIPTION OF THE DRAWINGS

The present invention provides its benefits across a broad spectrum of machining operations and workpieces. While the description which follows hereinafter is meant to be representative of a number of such applications, it is not exhaustive. As those skilled in the art will recognize, the basic methods and apparatus taught herein can be readily adapted to many uses. It is applicant's intent that this specification and the claims appended hereto be accorded a breadth in keeping with the scope and spirit of the invention being disclosed despite what might appear to be limiting language imposed by the requirements of referring to the specific examples disclosed.

Referring particularly to the drawings for the purposes of illustration only and not limitation.

DETAILED DESCRIPTION OF THE PREFERRED EMBODIMENTS

Figure 1:
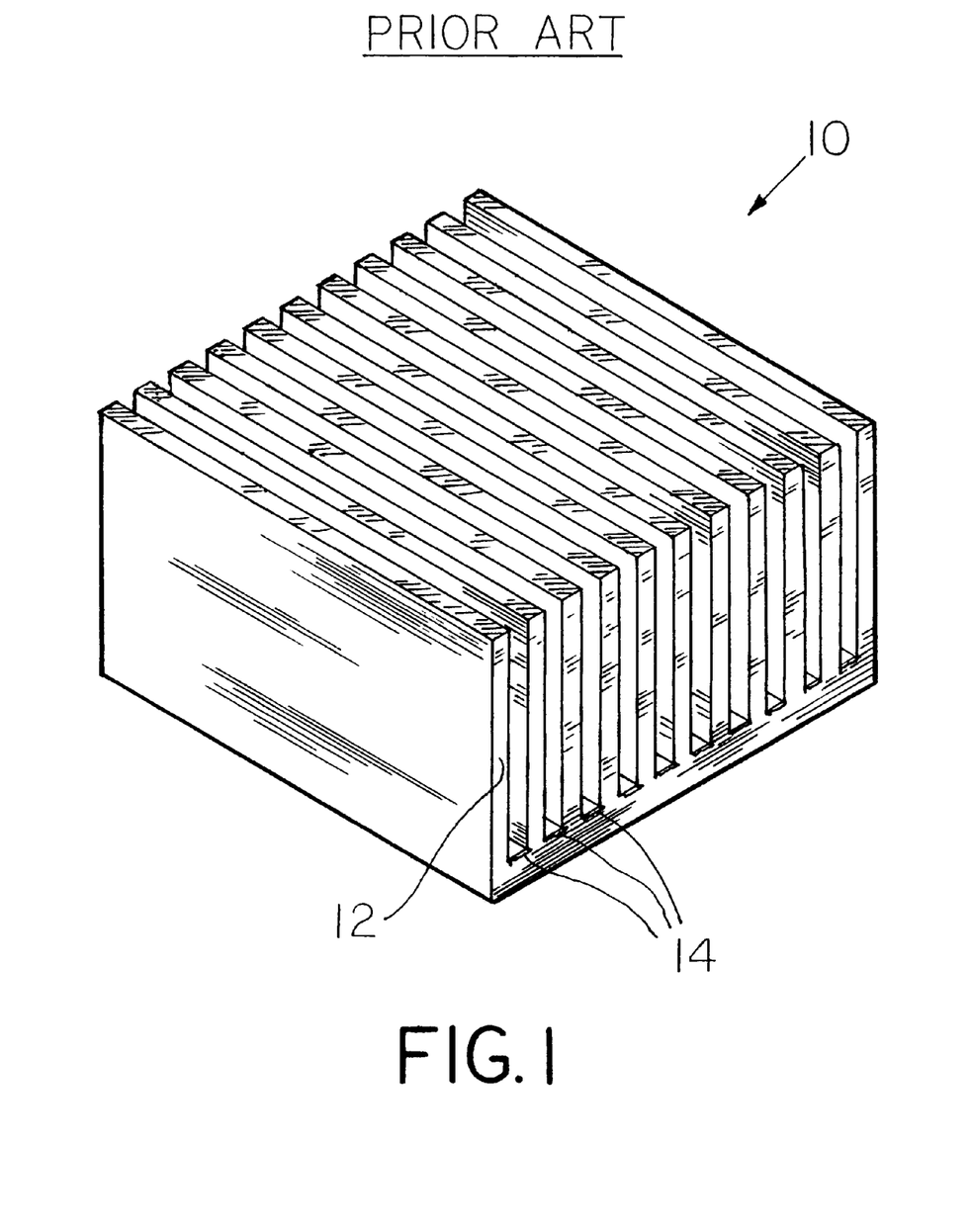
FIG. 1 is an isometric view of a prior art heat sink before deburring.
Figure 2:
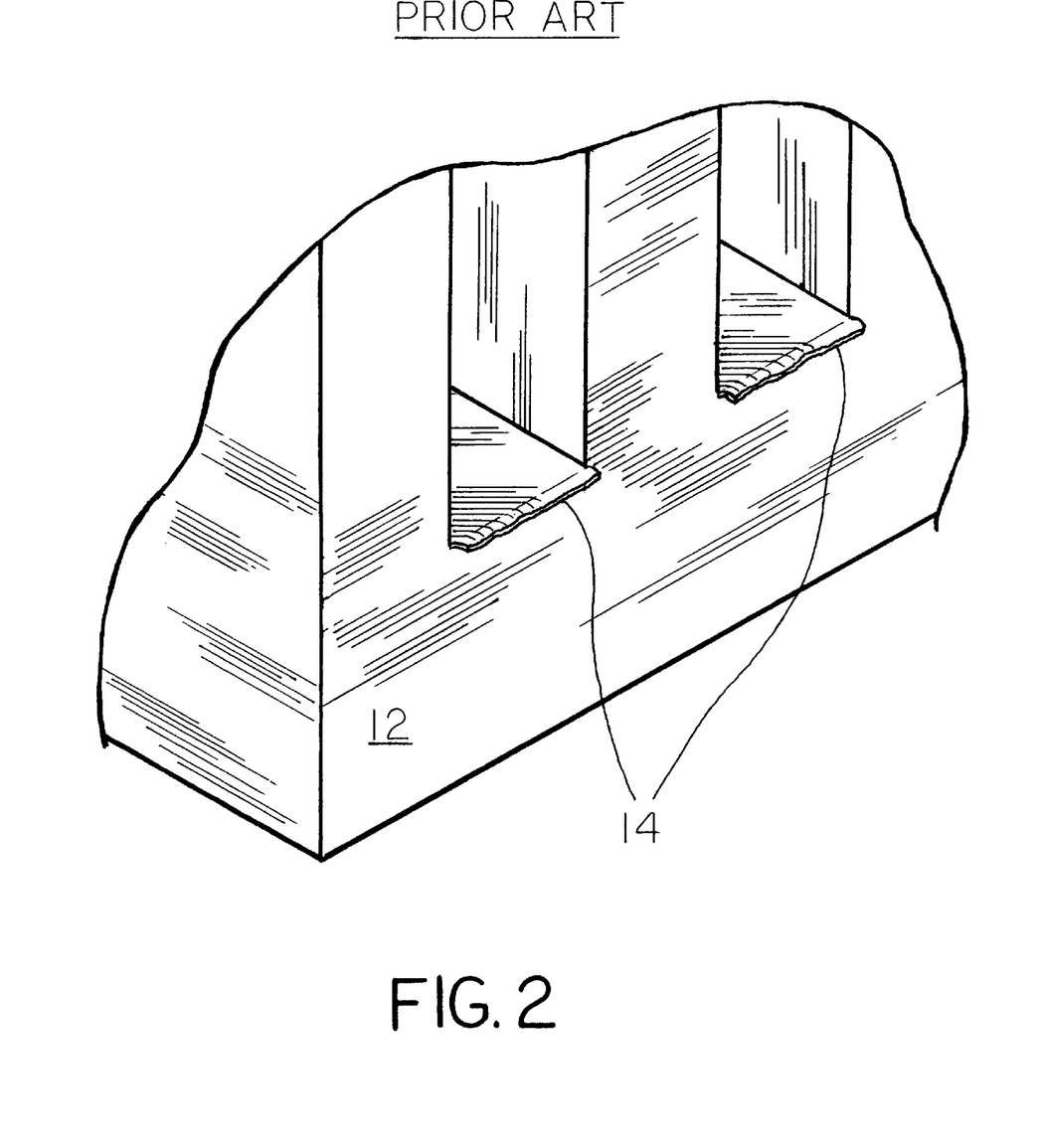
FIG. 2 is an isometric fragmentary view of a prior art heat ink showing the burrs at the bottoms of the cuts.

Referring now to the drawings for the purposes of illustration and not limitation, wherein like reference numerals designate identical or corresponding parts throughout the several views, there is illustrated generally at 10 a prior art heat sink which has been formed by gang sawing several cuts through the body of the heat sink to the exit side 12. Burrs, of which 14 is typical are formed at the bottom of the cuts on the exit side of the heat sink 10. Before it can be used for its intended purpose, these burrs must be removed. These burrs 14 are illustrated in more detail in FIG. 2.

Figure 3:
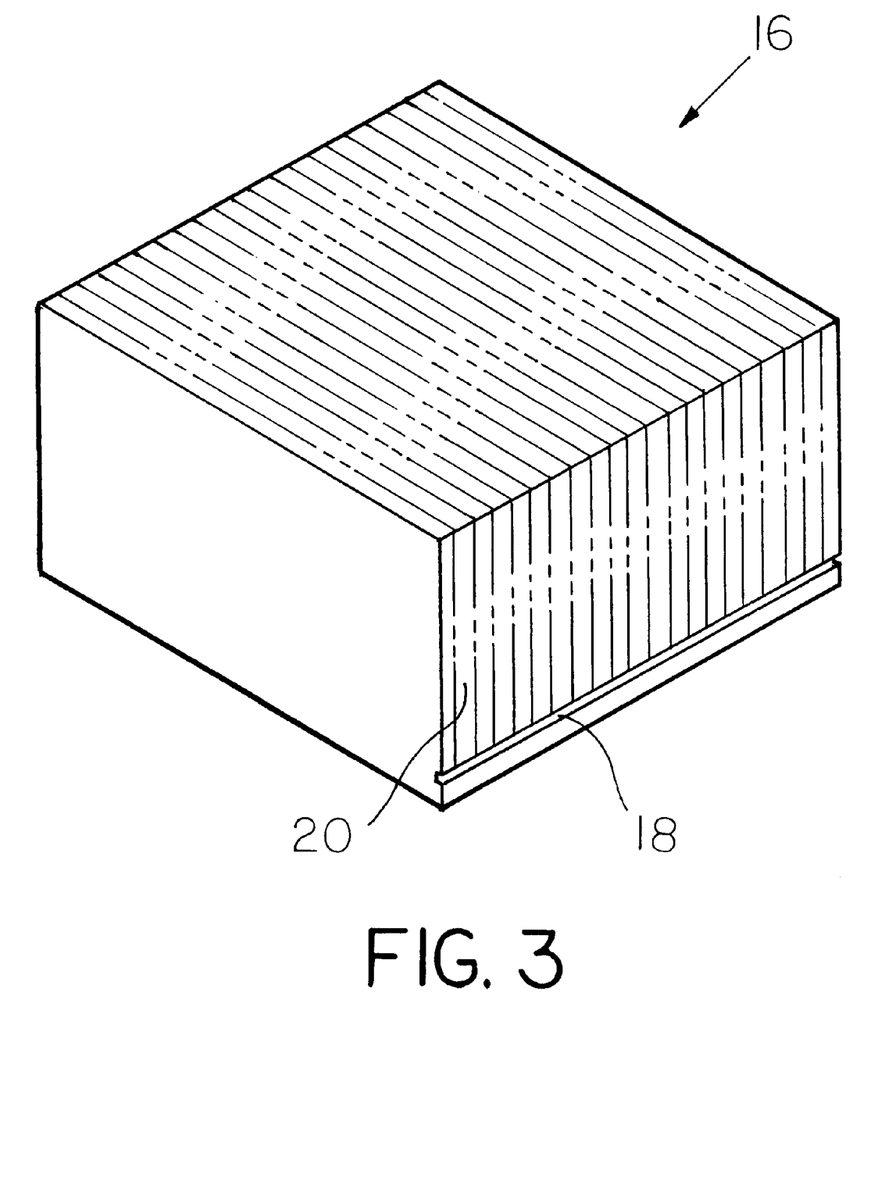
FIG. 3 is an isometric view of a blank workpiece with a burr concealing notch according to the present invention.
Figure 4:
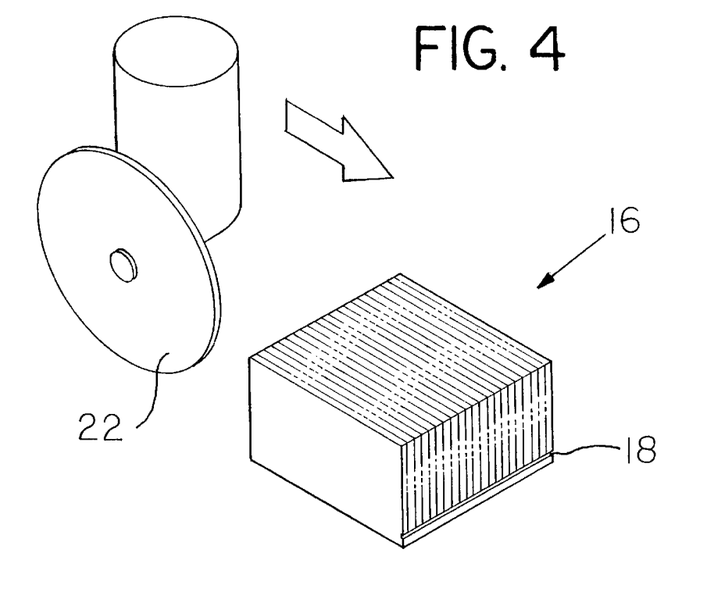
FIG. 4 is an isometric diagrammatic view of the workpiece of FIG. 3 as it is about to be cut by a metal cutting saw.
Figure 5:
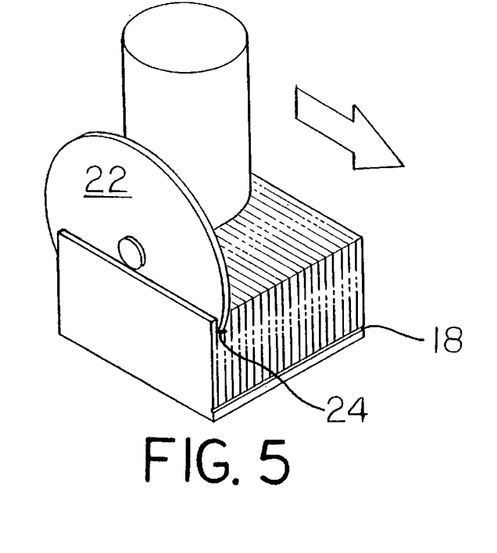
FIG. 5 is an isometric diagrammatic view of the workpiece of FIG. 3 partially cut through by a metal cutting saw.
Figure 6:
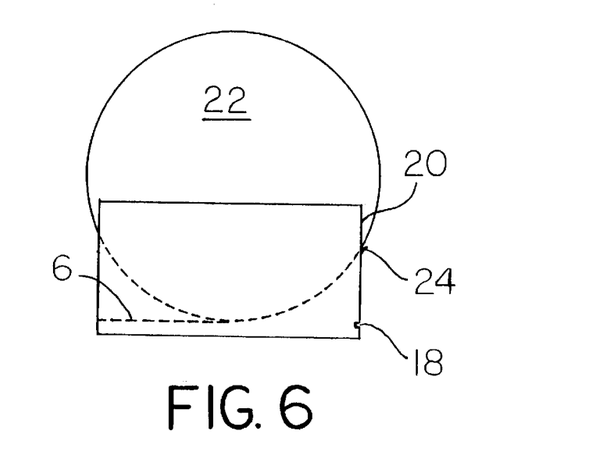
FIG. 6 is an elevational diagrammatic view similar to FIG. 5.
Figure 7:
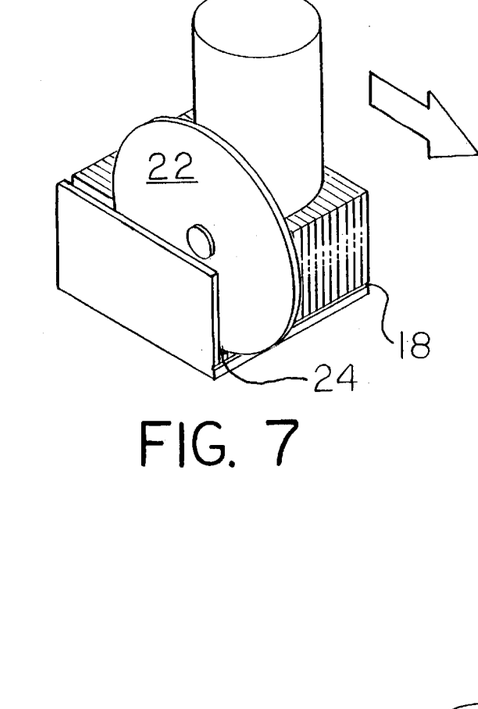
FIG. 7 is an isometric diagrammatic view similar to FIG. 5 owing the cut at a further advanced stage.
Figure 8:
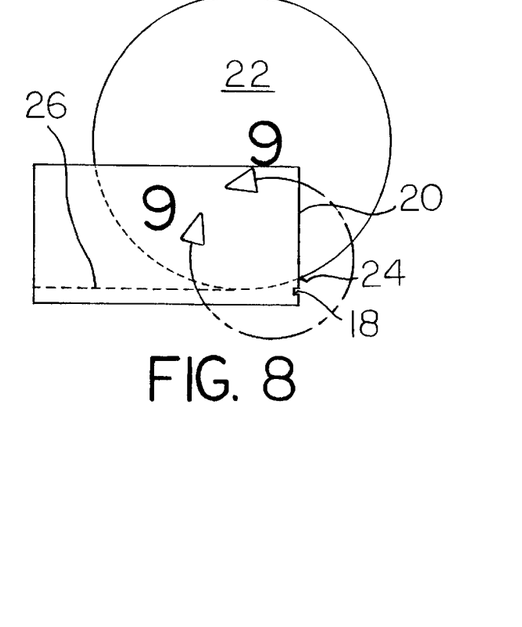
FIG. 8 is an elevational diagrammatic view similar to FIG. 7.
Figure 9:
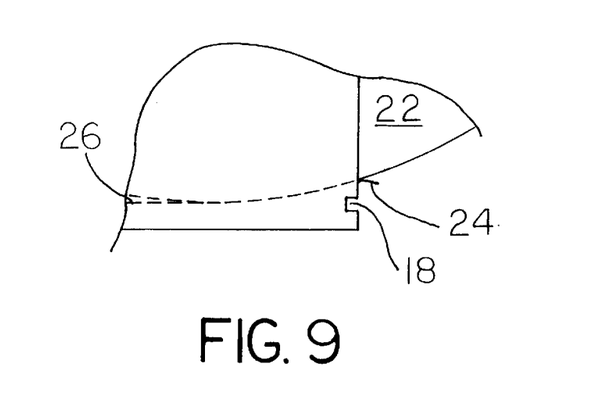
FIG. 9 is an exploded fragmented diagrammatic view of FIG. 8.

A workpiece blank according to the present invention is indicated generally at 16 in FIG. 3. Workpiece blank 16 shows in phantom lines where cuts will be formed to provide a heat sink for use in cooling electronic components such as chips, packages, and the like. An elongated notch 18 is formed on the exit side 20 of the workpiece. FIG. 4 diagrammatically illustrates the workpiece 16 in position to be cut by metal saw blade 22.

Figure 10:
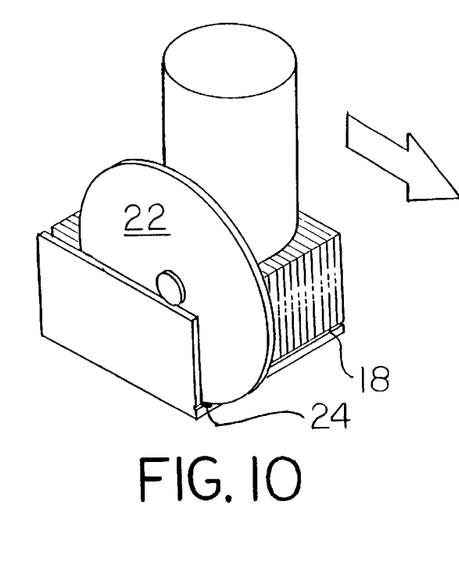
FIG. 10 is an isometric diagrammatic view similar to FIG. 5 showing the cut at a further advanced stage in contact with the elongated notch.
Figure 11:
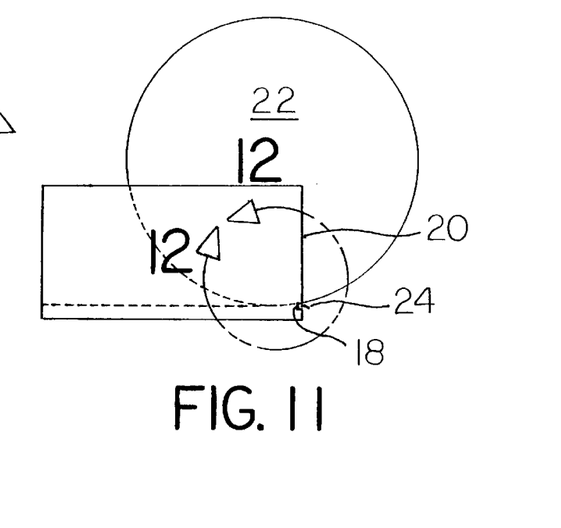
FIG. 11 is an elevational diagrammatic view of FIG. 10.
Figure 12:
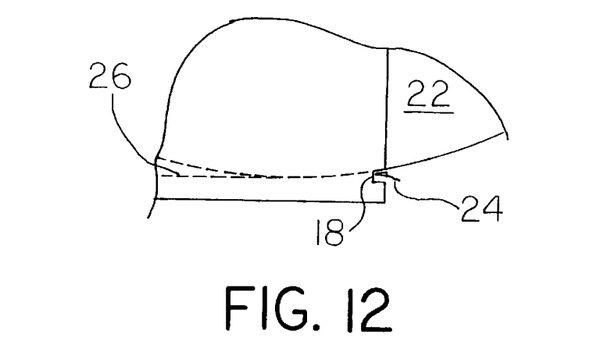
FIG. 12 is an exploded fragmented diagrammatic view of FIG. 11.

The sequential progress of the formation of the cut in workpiece 16 is indicated diagrammatically in FIGS. 4 through 13. As soon as the metal saw blade 22 breaks through exit side 20 a burr 24 forms at the bottom of the cut. The bottom of the finished cut is illustrated at 26. The burr 24 follows the bottom of the cut as it progresses down the flat surface of exit side 20. Referring to FIGS. 10 through 12, when the saw blade 22 reaches the transition between the flat surface of exit side 20 and notch 18, this burr 24 is ejected. As the saw blade reaches its maximum depth in notch 18, a small burr 38 forms on the burr wall 36 of notch 18, but remains within notch 18, recessed from the surface of exit side 20. The small burr 38 recessed within notch 18 can be seen, for example, in FIGS. 13 through 18.

Burr 24 is quite large compared the small burr 38 that remains within notch 18 after the cut is made. Without the notch 18 in the workpiece, the burr 24 would remain at the edge of the workpiece after the cut, as shown in the prior art FIGS. 1 and 2. With the notch 18 in the workpiece, the large burr 24 is ejected near the end of the cut, as shown in FIG. 12. The burr 38 that remains after the cut is finished is significantly smaller than the large burr 24 because very little material in the workpiece is cut after the large burr 24 is ejected.

It has been discovered that the present invention is particularly well suited for machining burr-free pin-finned heat sinks from extruded material. Pin-finned heat sinks have been widely used in the electronics industries for dissipating heat from electronic components. In this industry it is desirous to mass produce pin-finned heat sinks, and the like, at the lowest possible cost. One economical method of manufacturing pin-finned heat sinks is by cross-cutting extruded material, such as aluminum, by an automated process. However, as discussed above and illustrated in FIG. 2, the burrs 14 remain on the edge of the heat sink after the cross-cutting operation is completed. Since it is anticipated that the pin-finned heat sinks will be installed and removed from electronic components manually, these burrs must be removed to prevent operator injury. It has been found that removal of the burrs becomes a significant cost, and limitation, in the mass production of pin-finned heat sinks. The cost in mass producing pin-finned heat sinks is increased as additional workers are required to remove the burrs left by the automated cross-cutting process. The rate at which workers can de-burr the heat sinks limits the rate at which the pin-finned heat sinks can be mass produced. This limit occurs because the rate at which workers can de-burr the heat sinks is substantially less than the rate at which they can be cross-cut by an automated process.

Figure 13:
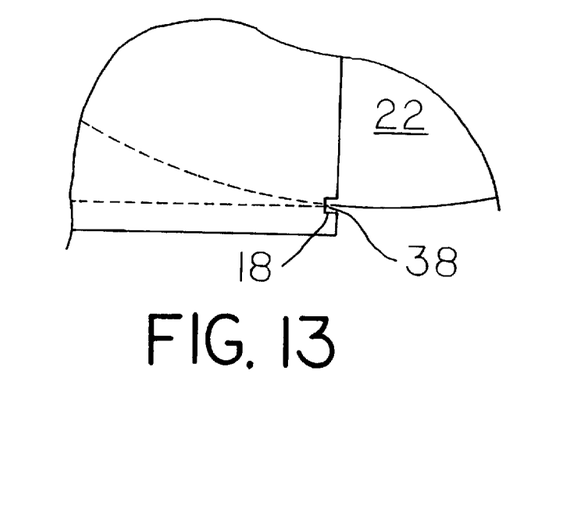
FIG. 13 is an exploded fragmented elevational view showing a completed cut in the workpiece.
Figure 14:
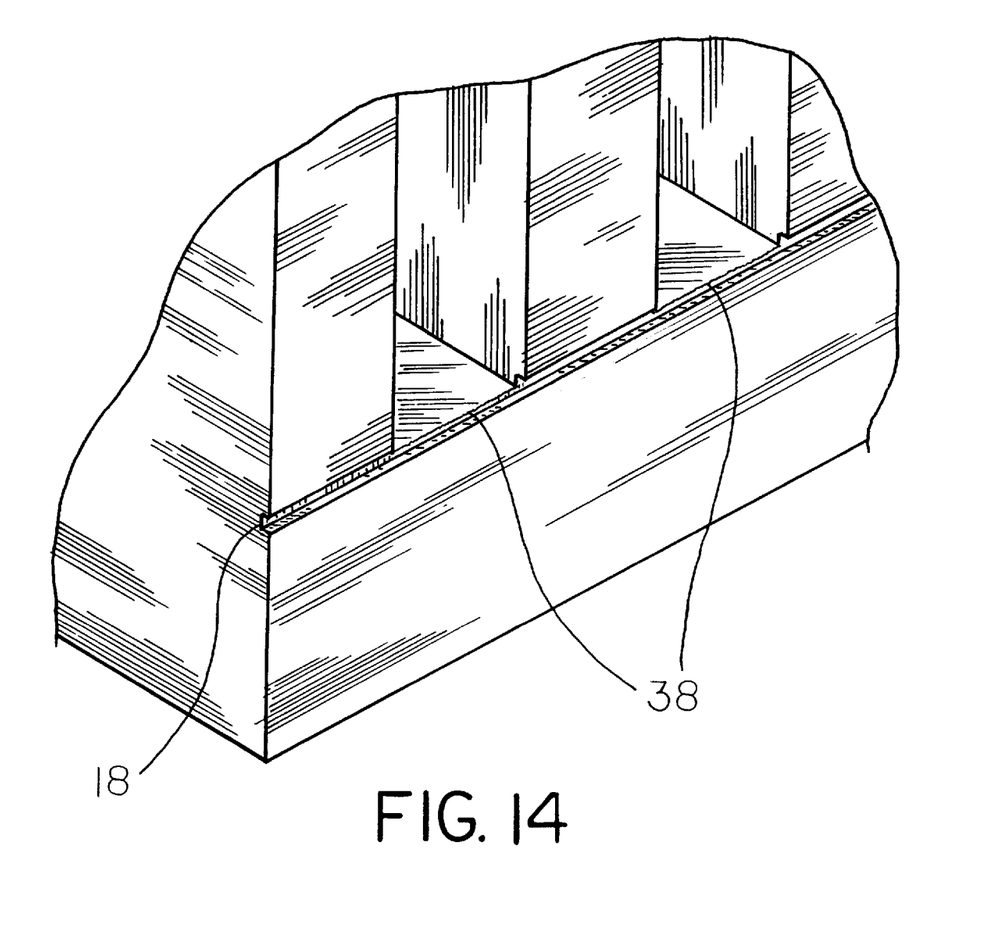
FIG. 14 is an isometric fragmentary view of a workpiece formed according to the present invention.
Figure 19:
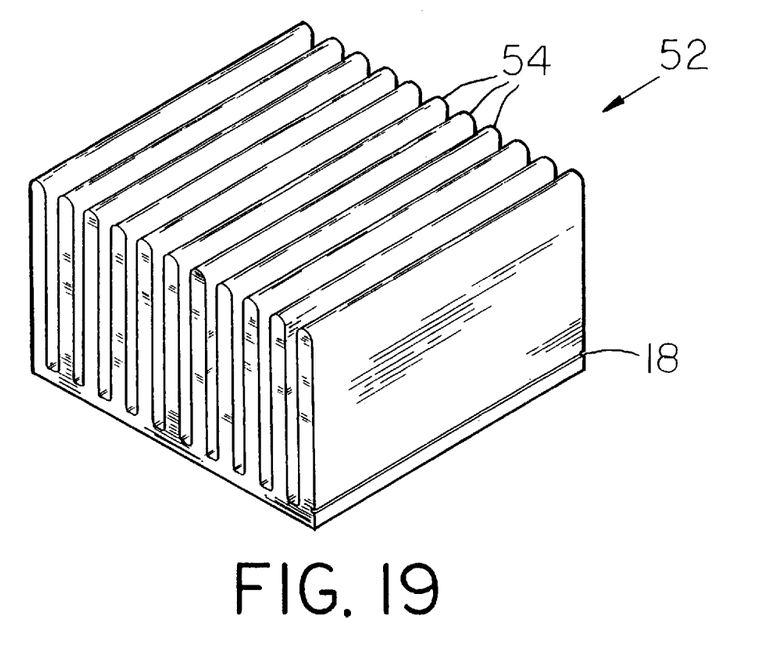
FIG. 19 is an isometric view of a heat sink having extruded fins and a burr concealing notch prior to being cut by a metal cutting saw.
Figure 20:
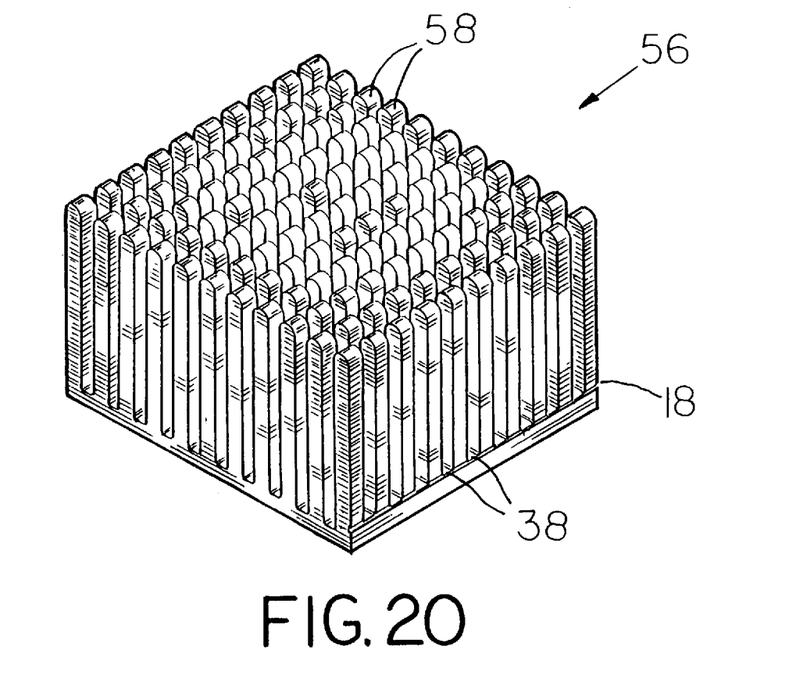
FIG. 20 is an isometric view of the heat sink shown in FIG. 19 having pinned fins formed after being cut by a metal cutting saw.

According to the present invention, these limitations are overcome. Referring to FIG. 19, there is illustrated generally at 52 extruded material prior to being machined into a burr-free pin-finned heat sink. The extruded material comprises a plurality of fins 54 established by the extrusion process. Prior to applying the automated cross-cutting process, notch 18 is provided on the exit side 20 of the extruded material, similar to that shown in FIG. 3. The notch 18 can also be provided by an automated process similar to the cross-cutting process. FIG. 20 shows the burr-free pin-finned heat sink, generally illustrated at 56, including a plurality of pins 58 that are established after the completion of the automated cross-cutting process. The cross-cutting process is similar to that shown in FIGS. 4 through 13. The resulting pin-finned heat sink made according to the present invention does not require a de-burring process and is essentially burr-free. As shown in FIG. 14, only a small burr 38 remains recessed within the notch 18. The rate of production of burr-free pin-finned heat sinks can be substantially increased, according to the present invention, since the manual de-burring step is eliminated.

Figure 15:
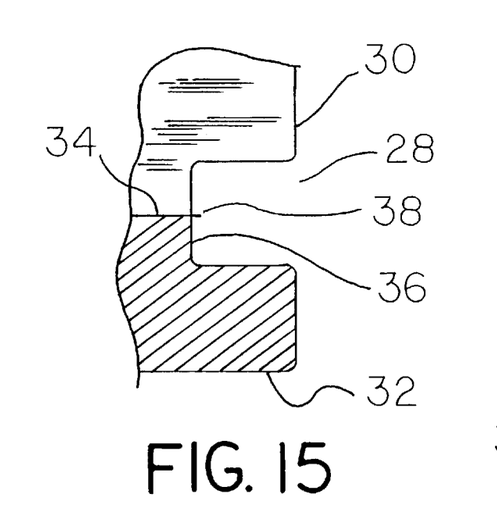
FIG. 15 is a fragmentary elevational view of one embodiment of a notch according to the present invention.
Figure 16:
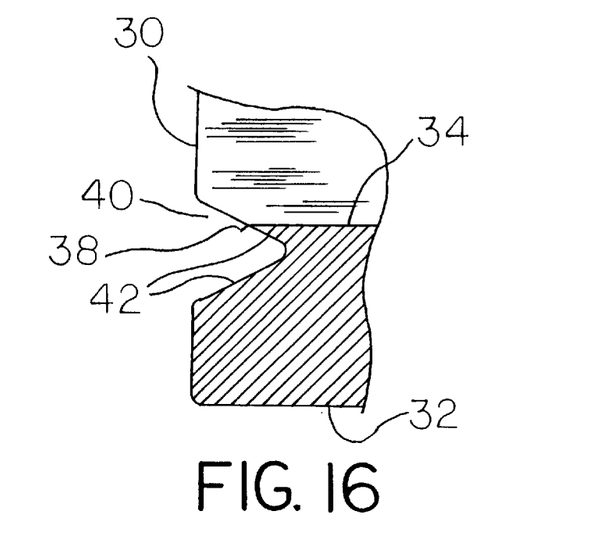
FIG. 16 is a fragmentary elevational view of a further embodiment of a notch according to the present invention.
Figure 17:
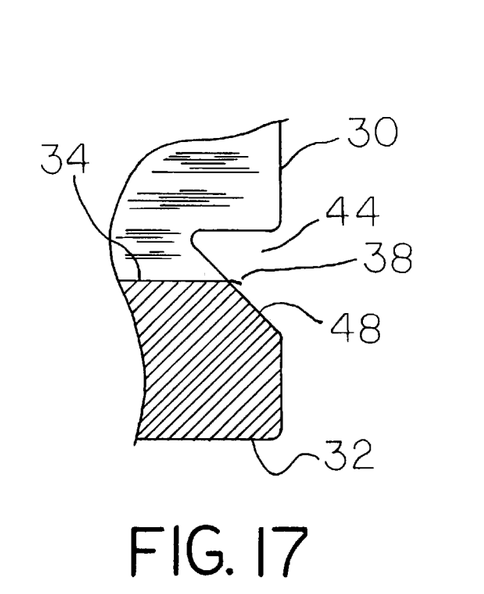
FIG. 17 is a fragmentary elevational view of an additional embodiment of a notch according to the present invention.
Figure 18:
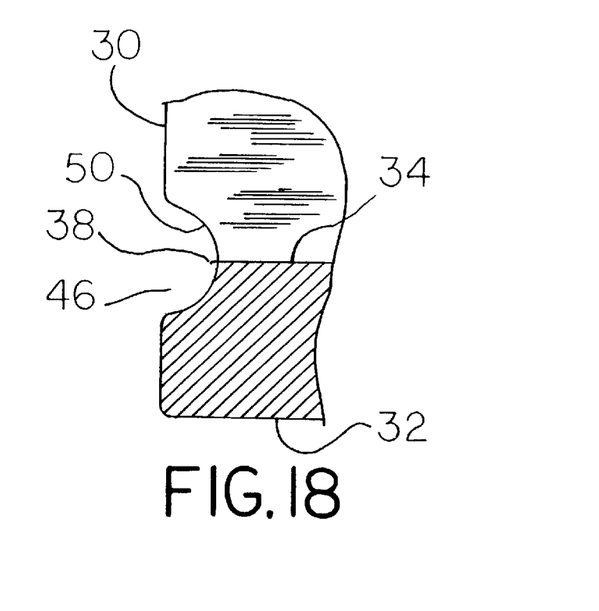
FIG. 18 is a fragmentary elevational view of another embodiment of a notch according to the present invention.

The notch according to the present invention can take numerous forms as illustrated, for example, in the accompanying FIGS. 15 through 18 where a few of the possible forms are illustrated. In FIG. 15 a generally rectangular notch 28 is formed in the exit side 30 of a workpiece 32. The bottom 34 of a cut terminates in burr wall 36. The burr 38 which is formed on burr wall 36 is recessed in and concealed by the notch 28. In the embodiment of FIG. 16, the notch 40 is in the form of a "V" with the burr wall being formed by the sloping walls 42 of the V. FIG. 17 illustrates an asymmetric notch 44, and FIG. 13 illustrates a generally arcuate notch 46. Other forms, such as, for example, "U" shaped notches, are suitable for use according to the present invention. Burr 38 is formed on angled burr wall 48 in the embodiment of FIG. 17, and on arcuate burr wall 50 in the embodiment of FIG. 18. In general, the rectangular notch in the embodiment of FIG. 15, and the arcuate notch of the embodiment of FIG. 18, are more forgiving of wide variations in the depth of the bottom 34 of the cut. Notches 44, FIG. 17, and 40, FIG. 16, are three sided in the sense that they are only open on one side. One of the sides in these embodiments is relatively small.

The tolerance on the depth of the cut defines an envelope. The bottom of the cut can be at any location within this envelope. The width of the notch must be sufficient to encompass that entire envelope, so that the bottom of the cut will always intersect with the notch at a location where the burr on the burr wall will be concealed within the notch. In general, straight sided notches such as that illustrated in FIG. 10 will accommodate larger tolerance envelopes than, for example, the "V" shaped notch of FIG. 11.

What has been described are preferred embodiments. Many modifications and variations of the present invention are possible in light of the above teachings. It is therefore to be understood that, within the scope of the appended claims, the invention may be practiced otherwise than as specifically described.

What is claimed is:

1. A method of forming a burr-free workpiece comprising:
    selecting a workpiece having an entry side and a generally opposed exit side, and a notch on said exit side;
    cutting said workpiece from said entry side towards said exit side with a cutting tool to form a cut having a bottom, said cutting forming an exit side burr on said exit side at said bottom;
    moving said cutting tool into said notch;
    allowing said exit side burr to be ejected as said cutting tool moves into said notch; and
    terminating said cutting with said bottom in said notch.
2. A method of forming a burr-free workpiece of claim 1 including forming said notch with a depth below said exit side and a width, said depth being greater than approximately one-half said width.
3. A method of forming a burr-free workpiece of claim 1 including forming a second burr in said notch, said second burr having a length, forming said notch with a depth below said exit side, said depth being greater than said length.
4. A method of forming a burr-free workpiece of claim 1 selecting a workpiece wherein said notch has a width sufficient to accommodate variations in the location of said bottom.
5. A method of making a burr free cut in a workpiece, said burr free cut having a bottom surface within said workpiece, said workpiece having an entrance side and a generally opposed exit side, said burr free cut extending within said workpiece and exiting said exit side at a predetermined first depth, the method comprising:
    selecting a workpiece having a notch in said exit side, said notch including a burr wall recessed from said exit side; and
    cutting said workpiece with a cutting tool by passing said cutting tool through said workpiece to said exit side to form said bottom surface intersecting said burr wall.
6. A method of claim 5 including selecting an aluminum workpiece.
7. A method of claim 5 including cutting said workpiece with a saw blade.
8. A method of claim 5 including selecting a workpiece having an elongated notch in said exit side, and cutting said workpiece with a plurality of saw blades ganged together.
9. A workpiece having an entrance side, a generally opposed exit side, a cut extending within said workpiece through said exit side, said cut having a bottom surface at a predetermined first depth, said workpiece having a notch in said exit side, said notch including a burr wall recessed from said exit side, said burr wall intersecting said bottom surface at a location recessed from said exit.
10. A workpiece of claim 8 wherein said workpiece comprises aluminum.
11. A workpiece of claim 9 wherein said workpiece comprises an aluminum heat sink having an elongated notch in said exit side.
12. A method of forming a pin-fin heat sink for use in cooling electronic components comprising;
    forming an elongated bar of aluminum having a plurality of fins extending longitudinally thereof, a first side, a generally opposed second side, and a longitudinally extending notch in said second side; and
    passing a saw blade laterally through said elongated bar generally from said first side to said second side, and forming a lateral cut through said bar having a bottom surface intersecting said notch, whereby any burr formed at an exit end of said bottom surface is concealed within said notch.
13. A pin-fin heat sink for use in cooling electronic components comprising;
    an extruded aluminum body, said body having a heat absorbing base, a plurality of heat dissipating pin-fins integral with said base, a plurality of bottom surfaces at a transition between said base and said pin-fins;
    said base having at least one side, said side including a notch, said notch including a plurality of recessed burr walls established at an end of each said bottom surfaces and remote from said one side.

* * * * *